United States Patent
Kojima (10) Patent No.: US 12,265,768 B2
(45) Date of Patent: Apr. 1, 2025

(54) INTEGRATED CIRCUIT VERIFICATION DEVICE, INTEGRATED CIRCUIT VERIFICATION METHOD, AND NON-TRANSITORY COMPUTER READABLE MEDIUM

(71) Applicant: Kioxia Corporation, Tokyo (JP)

(72) Inventor: Yohei Kojima, Kawasaki (JP)

(73) Assignee: Kioxia Corporation, Tokyo (JP)

( * ) Notice: Subject to any disclaimer, the term of this patent is extended or adjusted under 35 U.S.C. 154(b) by 596 days.

(21) Appl. No.: 17/654,127

(22) Filed: Mar. 9, 2022

(65) Prior Publication Data

US 2022/0405451 A1 Dec. 22, 2022

(30) Foreign Application Priority Data

Jun. 22, 2021 (JP) .................................. 2021-102948

(51) Int. Cl.
*G06F 30/333* (2020.01)
*G06F 30/33* (2020.01)
*G06F 30/398* (2020.01)

(52) U.S. Cl.
CPC ............ *G06F 30/333* (2020.01); *G06F 30/33* (2020.01); *G06F 30/398* (2020.01)

(58) Field of Classification Search
CPC ...... G06F 30/333; G06F 30/33; G06F 30/398; G06F 11/2215
See application file for complete search history.

(56) References Cited

U.S. PATENT DOCUMENTS

| | | | |
|---|---|---|---|
| 6,651,225 B1 | 11/2003 | Lin et al. | |
| 7,292,970 B1 * | 11/2007 | Hurlock | G06F 30/33 717/124 |
| 8,701,060 B2 * | 4/2014 | Brinkmann | G06F 30/3323 716/136 |
| 10,084,771 B2 | 9/2018 | Kocher et al. | |
| 10,915,683 B2 | 2/2021 | Surisetty et al. | |

(Continued)

FOREIGN PATENT DOCUMENTS

| | | |
|---|---|---|
| CN | 102902834 A | 1/2013 |
| TW | 1621031 B | 4/2018 |

OTHER PUBLICATIONS

A. Hora, "What Code Is Deliberately Excluded from Test Coverage and Why?," 2021 IEEE/ACM 18th International Conference on Mining Software Repositories (MSR), Madrid, Spain, 2021, pp. 392-402, doi: 10.1109/MSR52588.2021.00051. (Year: 2021).*

*Primary Examiner* — Stacy Whitmore
(74) *Attorney, Agent, or Firm* — Oblon, McClelland, Maier & Neustadt, L.L.P.

(57) ABSTRACT

According to one embodiment, an integrated circuit verification device includes: a condition property information generation unit configured to generate a plurality of condition properties that have information which imposes limitations on circuit operations or input signals, based on condition statements in a code list of a design data file; an exclusion code generation unit configured to generate, from the code list, exclusion code which is proved not to be statically covered, and a first exclusion code list to which the plurality of condition properties are applied; and an exclusion code comparison unit configured to generate a second exclusion code list from a difference between the exclusion code and the first exclusion code list.

20 Claims, 12 Drawing Sheets

(56) References Cited

U.S. PATENT DOCUMENTS

| | | |
|---|---|---|
| 2003/0125920 A1 | 7/2003 | Matsuoka et al. |
| 2007/0277163 A1 | 11/2007 | Avresky |
| 2019/0235713 A1 | 8/2019 | Borenstein et al. |
| 2020/0057106 A1* | 2/2020 | Balasubramanian ............... H03M 1/1076 |

* cited by examiner

EXAMPLE OF COVERAGE DATABASE CODE

```
1    always_comb
2    if (a<b)                    ⎫
3    c = 10;                     ⎬ COVERED
4    else                        ⎭
5    c = 20;                       UNCOVERED    ⟹ EXTRACTION p1
6
7    always_comb                 ⎫
8    if (c ! = 10)               ⎬ COVERED
9    d = e+f;                      UNCOVERED    ⟹ EXTRACTION p2
10   else                        ⎫
11   d = e − f;                  ⎪
12                               ⎪
13   always_comb                 ⎬ COVERED
14   case(g)                     ⎪
15   2'b00 : h = 100;            ⎭
16   2'b01 : h = 150;              UNCOVERED    ⟹ EXTRACTION p3
17   2'b10 : h = 200;              UNCOVERED       EXTRACTION p4
18   2'b11 : h = 300;            ⎫
19   endcase                     ⎬ COVERED
20   ....                        ⎭
21   ....
22   ....        20TH TO 25TH LINES
23   ....        REPRESENT A SECTION OF CODE
24   ....        WHICH IS PROVED NOT TO BE
25   ....        STATICALLY COVERED
```

FIG. 5B

EXAMPLE OF COVERAGE DATABASE CODE

```
1   always_comb
2     if (a < b)
3       c = 10;
4     else
5       c = 20;
6
7   always_comb
8     if (c != 10)
9       d = e + f;
10    else
11      d = e - f;
12
13  always_comb
14    case(g)
15      2'b00 : h = 100;
16      2'b01 : h = 150;
17      2'b10 : h = 200;
18      2'b11 : h = 300;
19    endcase
20  ....
25  ....
```

- Lines 2–3: GENERATE CONDITION PROPERTY BASED ON CONDITION STATEMENT (a < b) CAUSING UNCOVERED CODE
- Line 5: EXTRACTED UNCOVERED CODE p1
- Lines 8–9: GENERATE CONDITION PROPERTY BASED ON CONDITION STATEMENT (c != 10) CAUSING UNCOVERED CODE
- Line 9: EXTRACTED UNCOVERED CODE p2
- Lines 14, 16: GENERATE CONDITION PROPERTIES BASED ON CONDITION STATEMENTS (g != 2'B01) AND (g != 2'B10) CAUSING UNCOVERED CODE
- Line 16: EXTRACTED UNCOVERED CODE p3
- Line 17: EXTRACTED UNCOVERED CODE p4

GENERATE ⇒

EXAMPLE OF GENERATED CONDITION PROPERTIES

```
property p1;
  @(posedge clk) a < b;
endproperty
assume property (p1);
```

GENERATE ⇒

```
property p2;
  @(posedge clk) c == 10;
endproperty
assume property (p2);
```

GENERATE ⇒

```
property p3;
  @(posedge clk) g != 2'b01;
endproperty
assume property (p3);
```

```
property p4;
  @(posedge clk) g != 2'b10;
endproperty
assume property (p4);
```

FIG. 6

EXAMPLE OF CONDITION PROPERTY LIST

```
property p1;
  @(posedge clk) a<b;
endproperty
assume property (p1);

property p2;
  @(posedge clk) c == 10;
endproperty
assume property (p2);

property p3;
  @(posedge clk) g ! = 2'b01;
endproperty
assume property (p3);

property p4;
  @(posedge clk) g ! = 2'b10;
endproperty
assume property (p4);
...
```

FIG. 7A

EXAMPLE OF EXCLUSION CODE IN A CASE WHERE CONDITION PROPERTY LIST IS NOT APPLIED:

EXAMPLE OF EXCLUSION CODE LIST IN A CASE WHERE CONDITION PROPERTY LIST IS APPLIED:

CODE NOT COVERED BASED ON CONDITION PROPERTY $p_1$

5   c = 20;
9   d = e + f;
20 ....
⋮
25 ....

CODE NOT COVERED BASED ON CONDITION PROPERTY $p_2$

5   c = 20;
9   d = e + f;
20 ....
⋮
25 ....

CODE NOT COVERED BASED ON CONDITION PROPERTY $p_3$

EXAMPLE OF EXCLUSION CODE LIST IN A CASE WHERE CONDITION PROPERTY LIST IS APPLIED:

CODE NOT COVERED BASED ON CONDITION PROPERTY p1

```
5    c = 20;
9    d = e + f;
```
← CONDITION PROPERTIES IN WHICH PIECES OF UNCOVERED CODE IN EXCLUSION CODE LIST ARE THE SAME AS EACH OTHER

COMPARE

CODE NOT COVERED BASED ON CONDITION PROPERTY p2

```
5    c = 20;
9    d = e + f;
```

COMPARE

CODE NOT COVERED BASED ON CONDITION PROPERTY p3

EXAMPLE OF PRESENTATION-USE
CONDITION PROPERTY LIST:

property p1;
 @(posedge clk) a<b;
endproperty
assume property (p1);

property p3;
 @(posedge clk) g ! = 2' b01;
endproperty
assume property (p3);

...

EXAMPLE OF PRESENTATION-USE
EXCLUSION CODE LIST:

CODE NOT COVERED BASED ON
CONDITION PROPERTY p1

5   c = 20;
9   d = e + f;

CODE NOT COVERED BASED ON
CONDITION PROPERTY p3

16   2' b01 : h = 150;

...

INTEGRATED CIRCUIT VERIFICATION DEVICE, INTEGRATED CIRCUIT VERIFICATION METHOD, AND NON-TRANSITORY COMPUTER READABLE MEDIUM

CROSS REFERENCE TO RELATED APPLICATIONS

This application is based upon and claims the benefit of priority from prior Japanese Patent Application No. P2021-102948 filed on Jun. 22, 2021, the entire contents of which are incorporated herein by reference.

FIELD

Embodiments described herein relate generally to an integrated circuit verification device, an integrated circuit verification method, and a non-transitory computer readable medium.

BACKGROUND

At present, code coverage is widely used as a representative index of test coverage, that is, verification accuracy, of logic circuits. Engineers may also collect a coverage database from a simulation and generate a coverage report to analyze the design of a detected item.

DETAILED DESCRIPTION

Certain embodiments will now be described with reference to drawings. In the description of the following drawings to be explained, the identical or similar reference sign is attached to the identical or similar part. However, it should be noted that the drawings are schematic.

Moreover, the embodiments described hereinafter merely exemplify the device and method for materializing the technical idea; and the embodiments do not specify the material, shape, structure, placement, etc. of each component part as the following. The embodiments may be changed without departing from the spirit or scope of claims.

In the following description, a central processing unit and a register transfer level may be expressed simply as a CPU and an RTL, respectively.

Certain embodiments provide an integrated circuit verification method, and a non-transitory computer readable medium which can efficiently exclude unverified code caused by the same underlying cause.

According to one embodiment, an integrated circuit verification device includes: a condition property information generation unit configured to generate a plurality of condition properties that have information which imposes limitations on circuit operations or input signals, based on condition statements in a code list of a design data file; an exclusion code generation unit configured to generate, from the code list, exclusion code which is proved not to be statically covered, and a first exclusion code list to which the plurality of condition properties are applied; and an exclusion code comparison unit configured to generate a second exclusion code list from a difference between the exclusion code and the first exclusion code list. The exclusion code comparison unit determines whether or not there is a first condition property and a second condition property in the plurality of condition properties with which at least some pieces of uncovered code in the second exclusion code list are the same as each other, and extracts a condition property including a signal close to an input from among the first condition property and the second property when there is the first condition property and the second condition property.

Embodiment (Integrated Circuit Verification Device)

Figure 1:
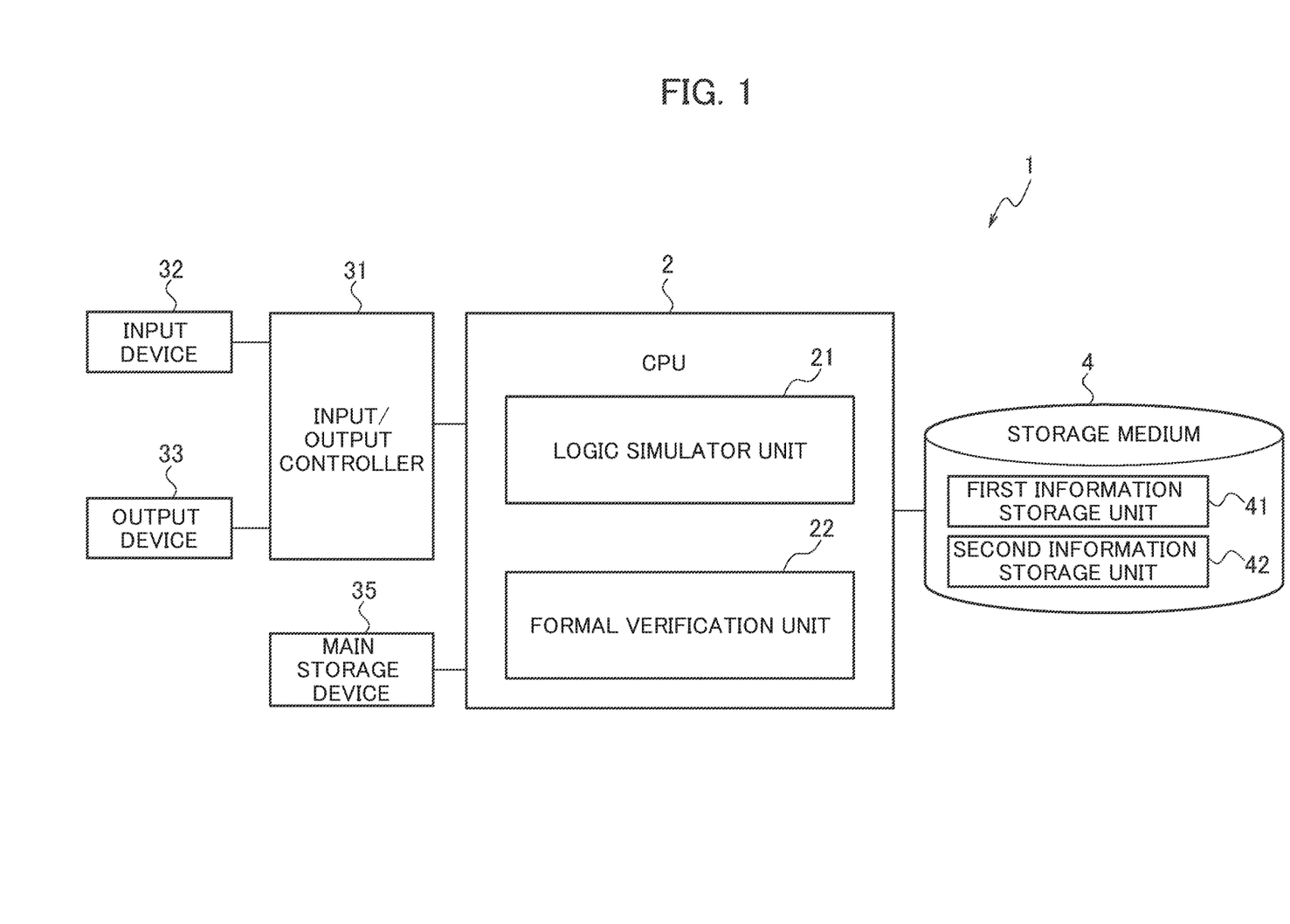
FIG. 1 is a schematic diagram showing a block configuration of an integrated circuit verification device according to an embodiment.

FIG. 1 shows an example of a block configuration of an integrated circuit verification device 1 according to an embodiment. As shown in FIG. 1, the integrated circuit verification device 1 includes a central processing unit 2, an input/output controller 31, an input device 32, an output device 33, a main storage device 35, and a storage medium 4. In the following description, the central processing unit 2 is referred to as the CPU 2.

The integrated circuit verification device 1 at least includes the CPU 2, the input device 32 and the output device 33 connected to the CPU 2 via the input/output controller 31, and the main storage device 35 and the storage medium 4 which are connected to the CPU 2. In practice, it is not limited to these configurations.

The CPU 2 includes a logic simulator unit 21 and a formal verification unit 22. The CPU 2 stores a computer program used in the integrated circuit verification device 1. The details of the logic simulator unit 21 and the formal verification unit 22 will be described later.

The input/output controller 31 is an interface for connecting the input device 32, the output device 33 and a reading unit (not shown) which is configured to read data of an external storage medium such as a compact disc ROM, a magnetic disk, or a flexible disk, to the CPU 2. The input/ output controller 31 functions as an interface of the input device 32, the output device 33, and the reading unit of an external storage device.

The input device 32 includes, for example, a keyboard, a mouse, a recognition device for OCR or the like, a graphic input device such as an image scanner, and a special input device such as a voice recognition unit.

The output device 33 includes, for example, a display device such as a liquid crystal display or a CRT display, and a printing device such as an inkjet printer or a laser printer. The main storage device 35 includes, for example, a ROM and a RAM. The ROM functions as a program storage device or the like for storing a program to be executed in the CPU 2. The ROM can be a non-transitory computer-readable recording medium in which a program is stored. The RAM temporarily stores data or the like used during program execution processing in the CPU 2 and functions as a temporary memory or the like used as a work area.

The storage medium 4 includes a first information storage unit 41 and a second information storage unit 42. The storage medium 4 stores input information data required to execute computer programs used for a logic simulation and a formal verification, data of the execution results of a logic simulation, and data of the execution results of a formal verification. The details of the first information storage unit 41 and the second information storage unit 42 will be described later.

Figure 2:
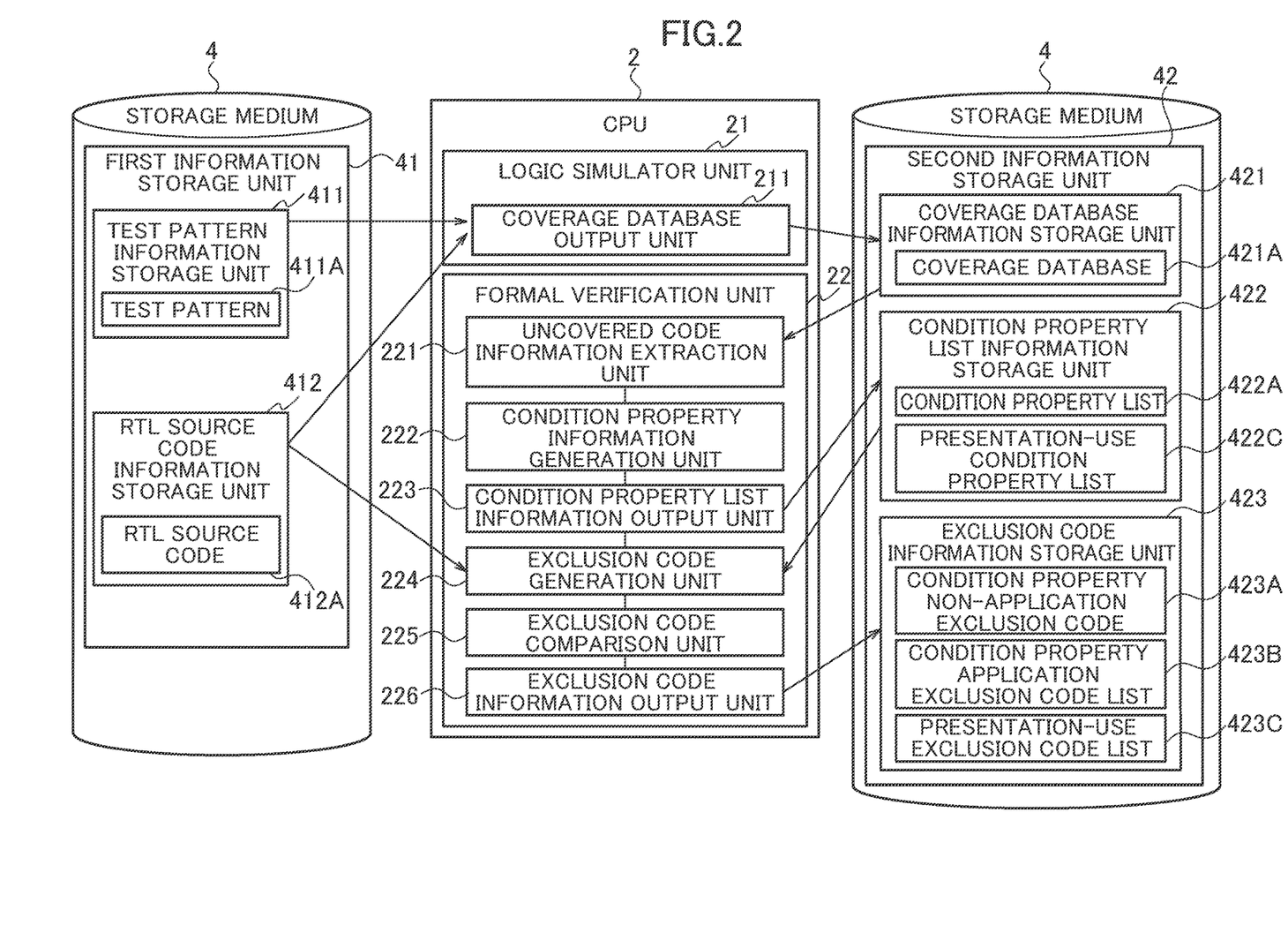
FIG. 2 is a detailed functional block diagram of a CPU and storage mediums of the integrated circuit verification device according to the embodiment.

Next, FIG. 2 shows an example of a detailed functional block diagram of the CPU 2 and storage mediums 4 of the integrated circuit verification device 1 according to the embodiment. As shown in FIG. 2, the CPU 2 includes the logic simulator unit 21 for executing a computer program used for a logic simulation of the integrated circuit verification device 1, and a formal verification unit 22 for executing a computer program used for a formal verification of the integrated circuit verification device 1.

The logic simulator unit 21 and the formal verification unit 22 may be, for example, a processing device that is a microprocessor, or a semiconductor integrated circuit (IC) having similar functions thereto. In practice, it is not limited to these configurations.

The logic simulator unit 21 includes a coverage database output unit 211. The coverage database output unit 211 outputs a coverage database 421A to a coverage database information storage unit 421 after executing a logic simulation.

The coverage database 421A includes, for example, coverage rate (coverage) information of source code, which is used for verification progress management, output by a logic simulation. The source code to be used may be, for example, a design under test (DUT) data file.

The formal verification unit 22 includes an uncovered code information extraction unit 221, a condition property information generation unit 222, a condition property list information output unit 223, an exclusion code generation unit 224, an exclusion code comparison unit 225, and an exclusion code information output unit 226.

The uncovered code information extraction unit 221 reads the coverage database 421A stored in the coverage database information storage unit 421 and extracts code that has not been verified. In the following description, unverified code is also referred to as uncovered code or uncovered. Further, verified code is also referred to as covered code or covered.

The condition property information generation unit 222 generates a plurality of condition properties based on condition statements causing each piece of uncovered code extracted by the uncovered code information extraction unit 221. The plurality of condition properties have, for example, information which imposes limitations on circuit operations or input signals.

The condition property list information output unit 223 lists the plurality of condition properties generated by the condition property information generation unit 222 and outputs a condition property list 422A to the condition property list information storage unit 422. The condition property list information output unit 223 makes a list in order of the condition properties with the largest amount of exclusion code excluded based on the condition properties, and outputs a presentation-use condition property list 422C to the condition property list information storage unit 422.

The exclusion code generation unit 224 generates exclusion code proved not to be statically covered by means of a formal verification, and a first exclusion code to which a plurality of condition properties are applied. In the following description, the code which is proven not to be covered after a formal verification is referred to as exclusion code. Further, the code which to which a plurality of condition properties are applied is referred to as a first exclusion code.

The exclusion code comparison unit 225 generates a second exclusion code list from a difference between the exclusion code and a first exclusion code list. In the following description, exclusion code in a case where the condition property list is not applied is also referred to as condition property non-application exclusion code 423A. The first exclusion code list in a case where the condition property list is applied is also referred to as a condition property application exclusion code list 423B.

The exclusion code comparison unit 225 determines whether or not there is a first condition property and a second condition property in the plurality of condition properties with which at least some pieces of uncovered code in the second exclusion code list are the same as each other. Thereafter, the exclusion code comparison unit 225 extracts a condition property including a signal close to an input from among the first condition property and the second condition property when there is the first condition property and the second condition property. A condition property to be determined from among the condition properties is not limited to the first condition property and the second condition property, and may be two or more conditional properties.

In a case where the condition property list is not applied when the formal verification is executed, the exclusion code information output unit 226 outputs the condition property non-application exclusion code 423A to the exclusion code information storage unit 423. In a case where the condition property list is applied when the formal verification is executed, the exclusion code information output unit 226 outputs the condition property application exclusion code list 423B to the exclusion code information storage unit 423. Further, the exclusion code information output unit 226 makes a list in order of the condition properties with the largest amount of exclusion code excluded based on the condition properties, and outputs a presentation-use exclusion code list 423C to the exclusion code information storage unit 423.

The first information storage unit 41 includes a test pattern information storage unit 411 and an RTL source code information storage unit 412.

The test pattern information storage unit 411 stores, for example, an input signal data file for a verification target circuit. A simulation control command may be provided. In the following description, the input signal data file for the verification target circuit is referred to as a test pattern 411A.

The test pattern 411A is input information data required to execute a computer program used in the integrated circuit verification device 1. The test pattern 411A may be input information data required to execute the logic simulator unit 21.

The RTL source code information storage unit 412 stores, for example, a design under test (DUT) data file. The design under test (DUT) data file may be, for example, register transfer level (RTL) source code. In the following description, the design under test (DUT) data file is referred to as RTL source code 412A.

The RTL source code 412A is input information data required to execute a computer program used in the integrated circuit verification device 1. The RTL source code 412A may be input information data required to execute the logic simulator unit 21. The RTL source code 412A may be input information data required to execute the formal verification unit 22.

The second information storage unit 42 includes a coverage database information storage unit 421, a condition property list information storage unit 422, and an exclusion code information storage unit 423.

The coverage database information storage unit 421 stores, for example, the coverage database 421A output from the coverage database information storage unit 421.

The coverage database 421A is input information data required to execute a computer program used in the integrated circuit verification device 1. The coverage database 421A may be input information data required to execute the formal verification unit 22.

The condition property list information storage unit 422 stores the condition property list 422A output from the condition property list information output unit 223, and the presentation-use condition property list 422C.

The condition property list 422A is input information data required to execute a computer program used in the integrated circuit verification device 1. The condition property list 422A may be input information data required to execute the formal verification unit 22.

The exclusion code information storage unit 423 stores the condition property non-application exclusion code 423A, the condition property application exclusion code list 423B, and the presentation-use exclusion code list 423C which are output from the exclusion code information output unit 226.

(Integrated Circuit Verification Method)

Next, a schematic flowchart of the integrated circuit verification method of the integrated circuit verification device 1 according to the embodiment will be described.

Figure 3:
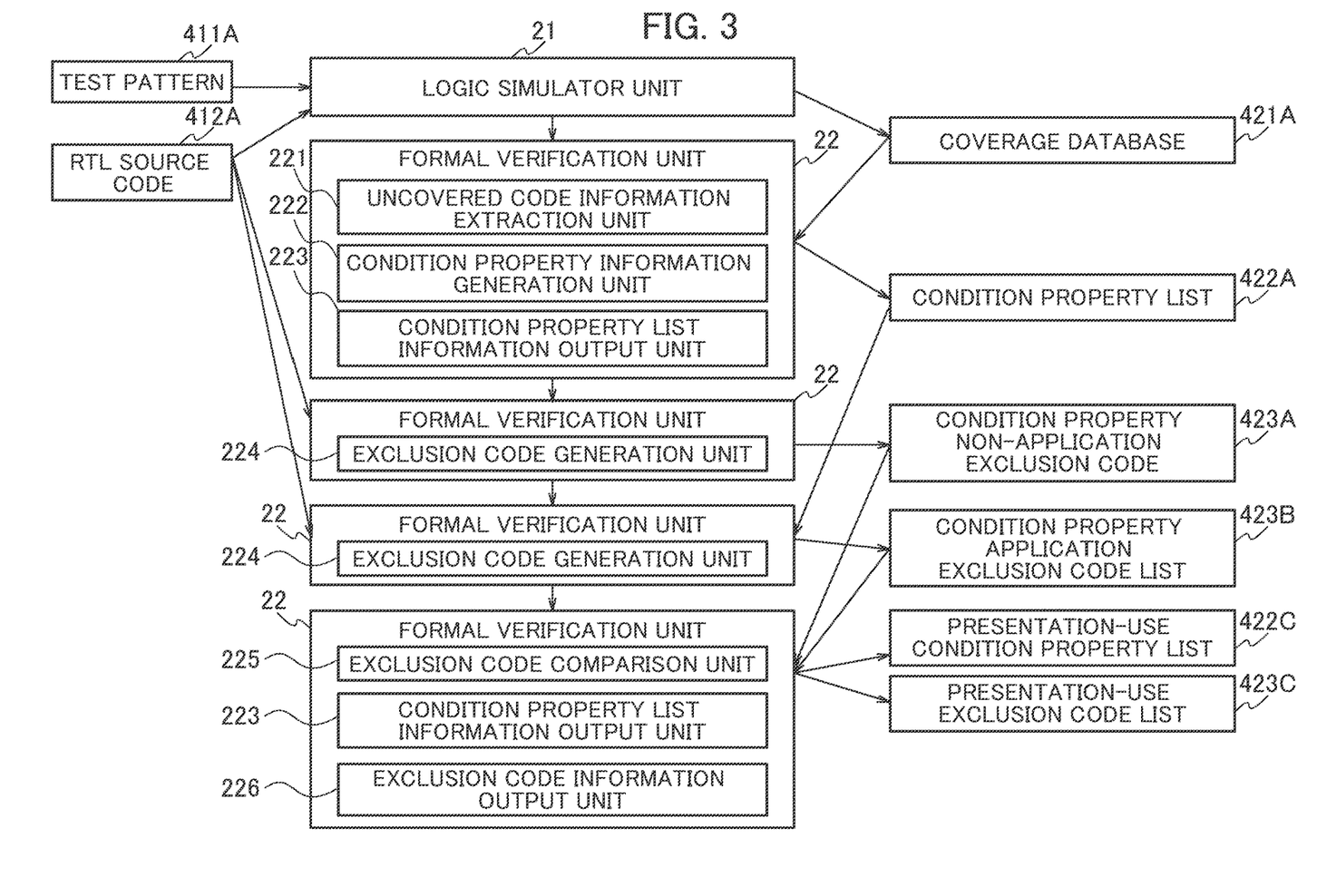
FIG. 3 is a schematic flowchart of an integrated circuit verification method of the integrated circuit verification device according to the embodiment.

FIG. 3 shows an example of a schematic flowchart of the integrated circuit verification method of the integrated circuit verification device 1 according to the embodiment.

First, the logic simulator unit 21 performs dynamic analysis using the test pattern 411A and the RTL source code 412A as input data. The dynamic analysis is performed by using the logic simulator unit 21.

Next, the formal verification unit 22 performs static analysis using the coverage database 421A as input data. The static analysis is performed by using the formal verification unit 22. Specifically, the uncovered code information extraction unit 221 extracts uncovered code from the read coverage database 421A. The condition property information generation unit 222 generates a plurality of condition properties based on the condition statements causing the extracted uncovered code. The condition property list information output unit 223 lists the generated plurality of condition properties and outputs the condition property list 422A.

Next, the formal verification unit 22 performs static analysis using the RTL source code 412A as input data. Specifically, the exclusion code generation unit 224 generates code which is proved not to be covered by the read RTL source code 412A as exclusion code. The condition property list information output unit 223 may output the condition property non-application exclusion code 423A, which is the generated exclusion code. This exclusion code is code which is proved not to be statically covered among the code determined as uncovered code in the coverage database, such as when a fixed value is assigned to a signal, or when the signal does not pass through one of the condition branches due to propagation of the signal.

Next, the formal verification unit 22 performs static analysis using the RTL source code 412A and the condition property list 422A as input data. Specifically, the exclusion code generation unit 224 generates, as a first exclusion code list, code that is not covered for each condition property based on the read RTL source code 412A and the condition property list 422A. The condition property list information output unit 223 may sort the listed exclusion code and output the condition property application exclusion code list 423B, which is the first exclusion code list. Each piece of exclusion code in this list is an added piece of code which is proved not to be covered by application of each condition property, as compared with the condition property non-application exclusion code 423A.

Finally, the formal verification unit 22 performs static analysis using the condition property non-application exclusion code 423A and the condition property application exclusion code list 423B as input data. Specifically, the exclusion code comparison unit 225 compares exclusion code of the read condition property non-application exclusion code 423A with an exclusion code list of the condition property application exclusion code list 423B. Then, the exclusion code comparison unit 225 determines whether there are a plurality of condition properties with which at least some pieces of the uncovered code in the exclusion code list are the same as each other based on the exclusion code. The exclusion code comparison unit 225 lists the plurality of condition properties and the exclusion code list. The condition property list information output unit 223 and the exclusion code information output unit 226 output the presentation-use condition property list 422C and the presentation-use exclusion code list 423C.

Next, a detailed flowchart of the integrated circuit verification method of the integrated circuit verification device 1 according to the embodiment will be described.

Figure 4A:
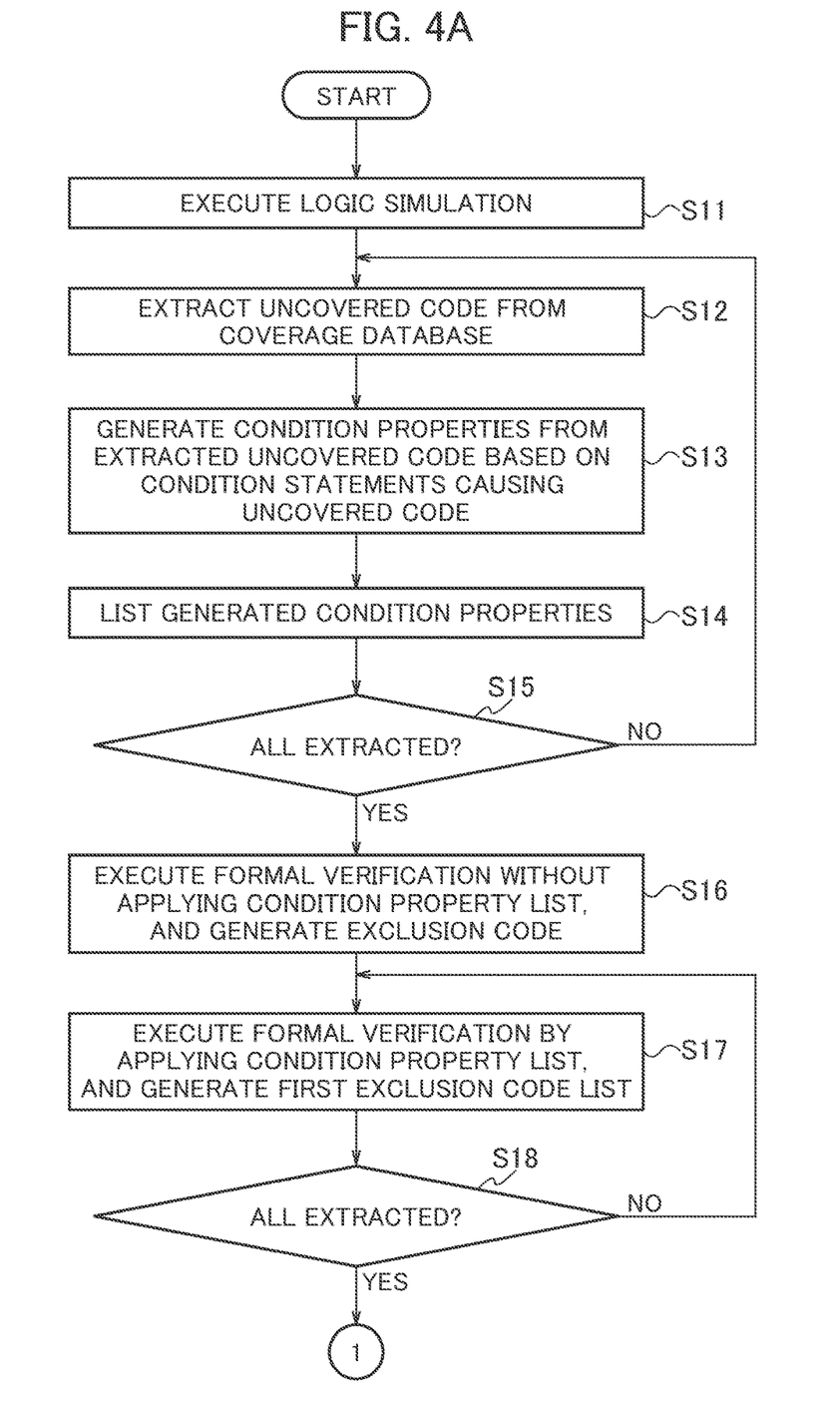
FIG. 4A is a detailed flowchart of the integrated circuit, verification method of the integrated circuit verification device according to the embodiment (part 1).
Figure 4B:
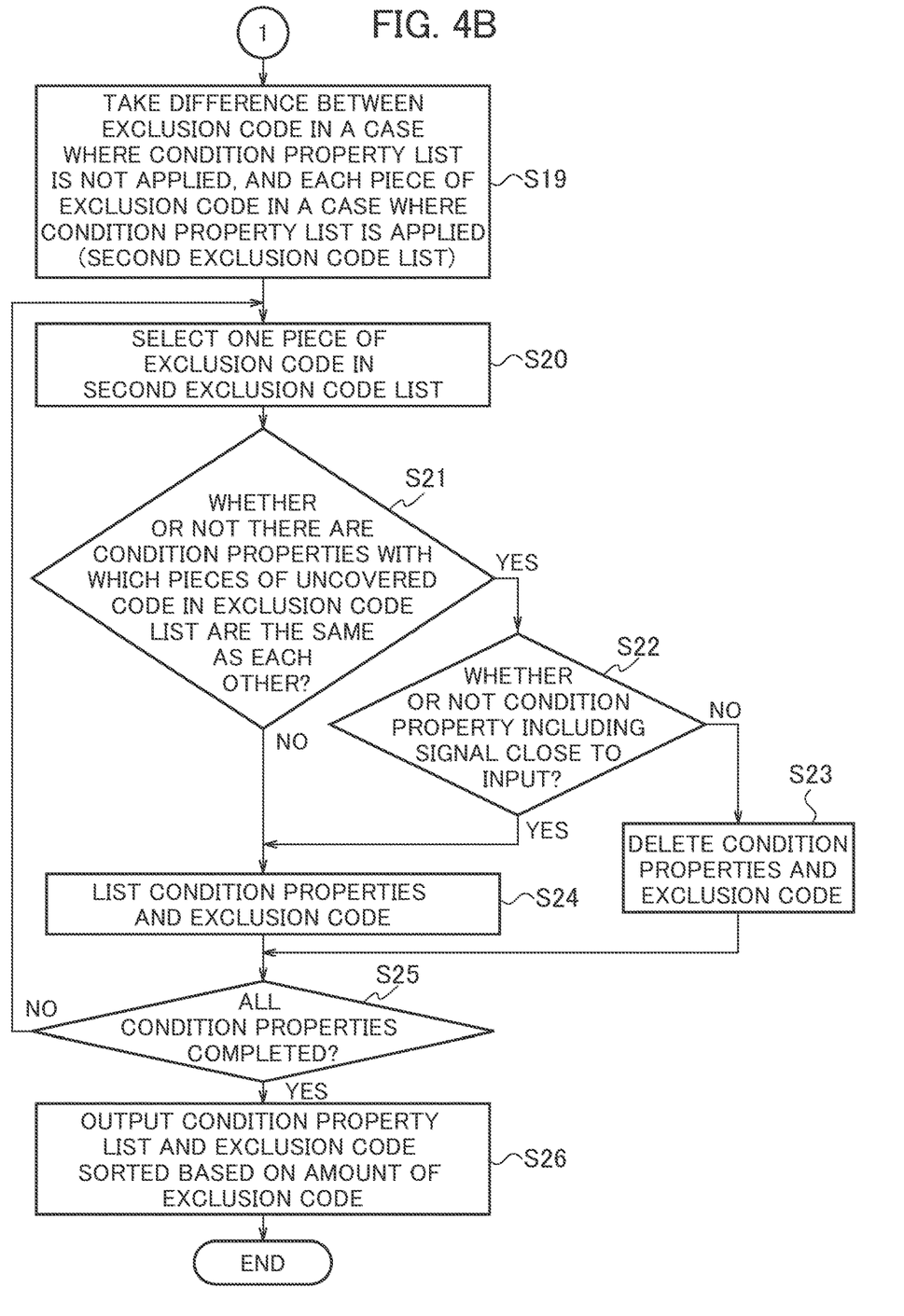
FIG. 4B is a detailed flowchart of the integrated circuit verification method of the integrated circuit verification device according to the embodiment (part 2).
Figure 5A:
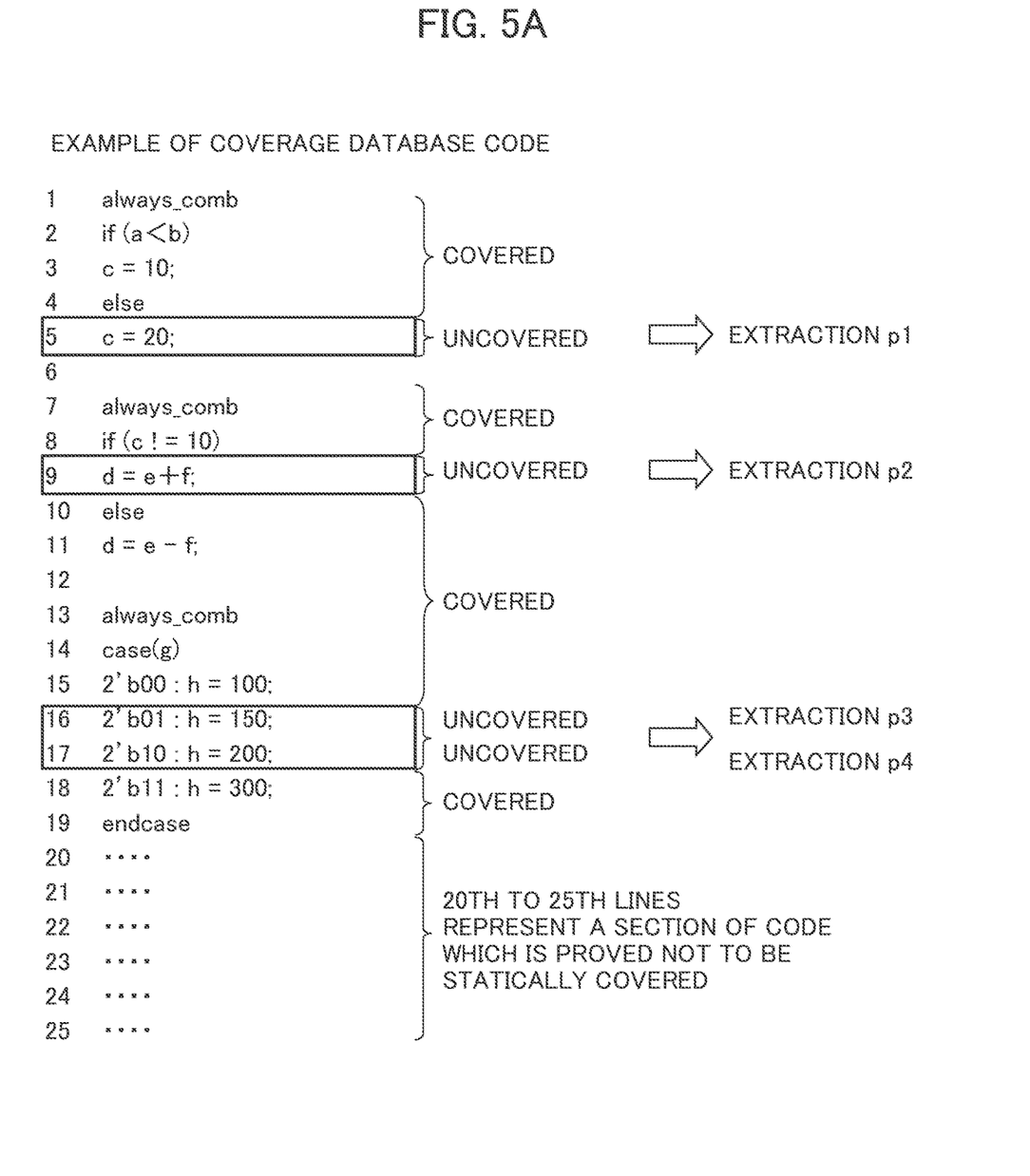
FIG. 5A shows an example of coverage database code according to the embodiment.
Figure 5B:
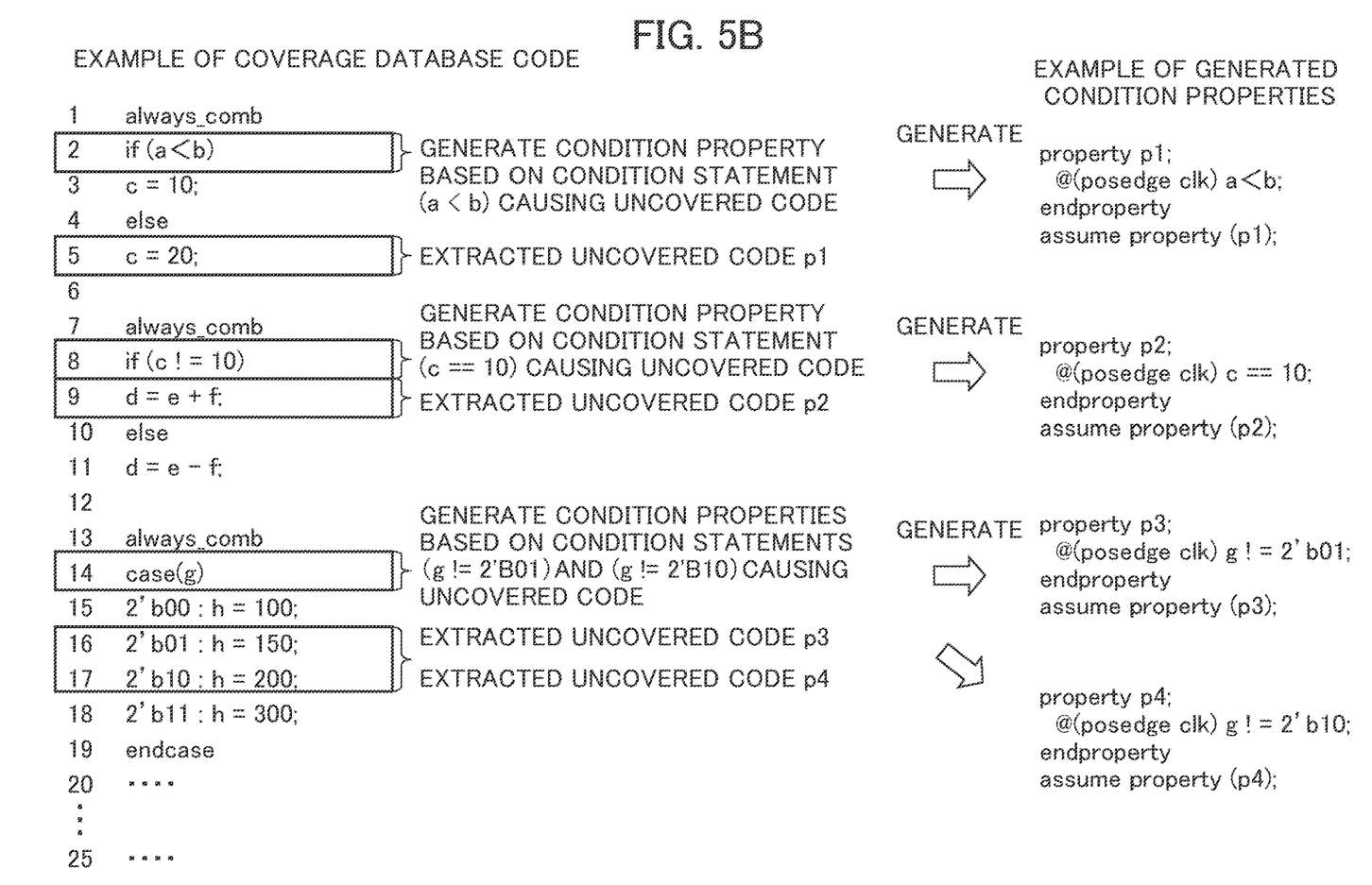
FIG. 5B shows an example of the coverage database code and an example of condition properties generated based on an example of the coverage database code.
Figure 6:
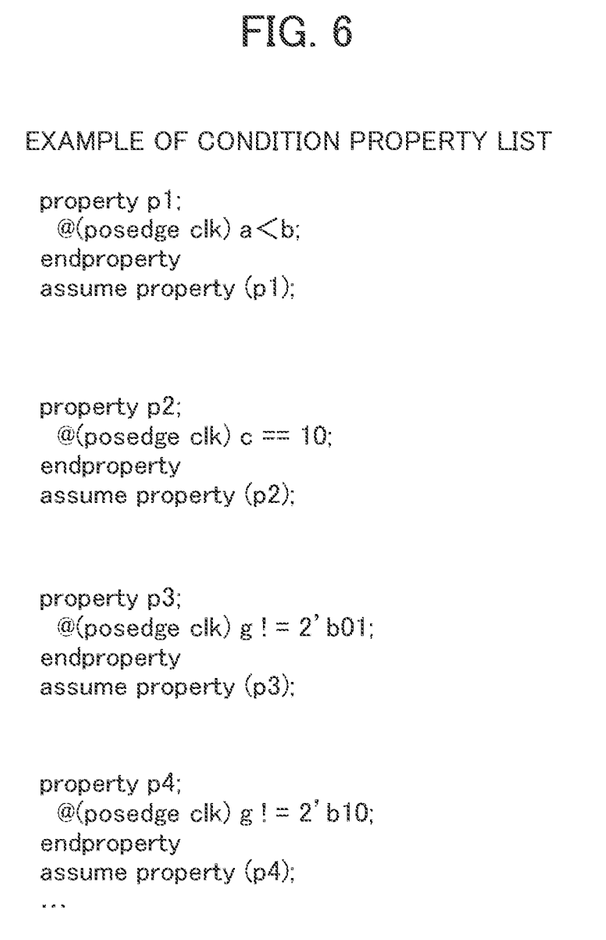
FIG. 6 shows an example of a condition property list.
Figure 7A:
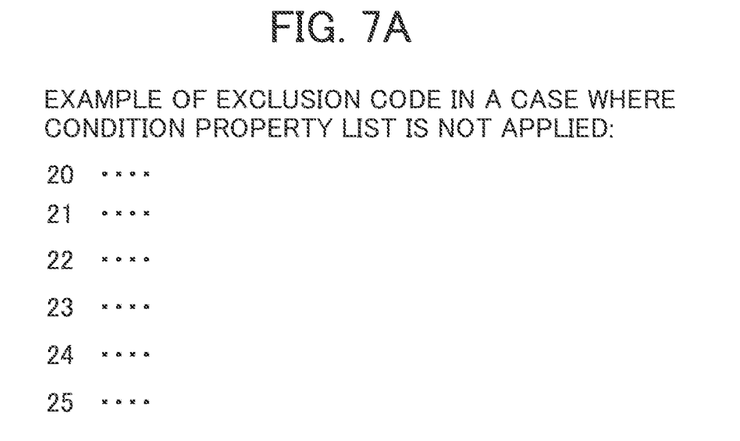
FIG. 7A shows an example of exclusion code in a case where the condition property list is not applied.
Figure 7B:
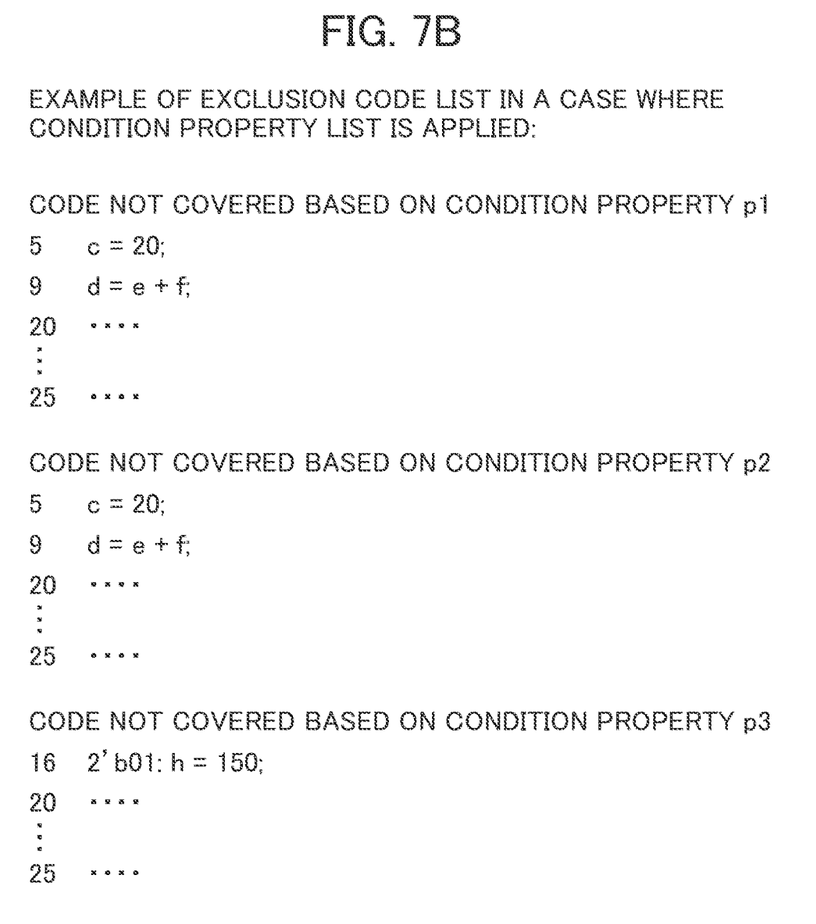
FIG. 7B shows an example of a first exclusion code list in a case where the condition property list is applied.
Figure 8A:
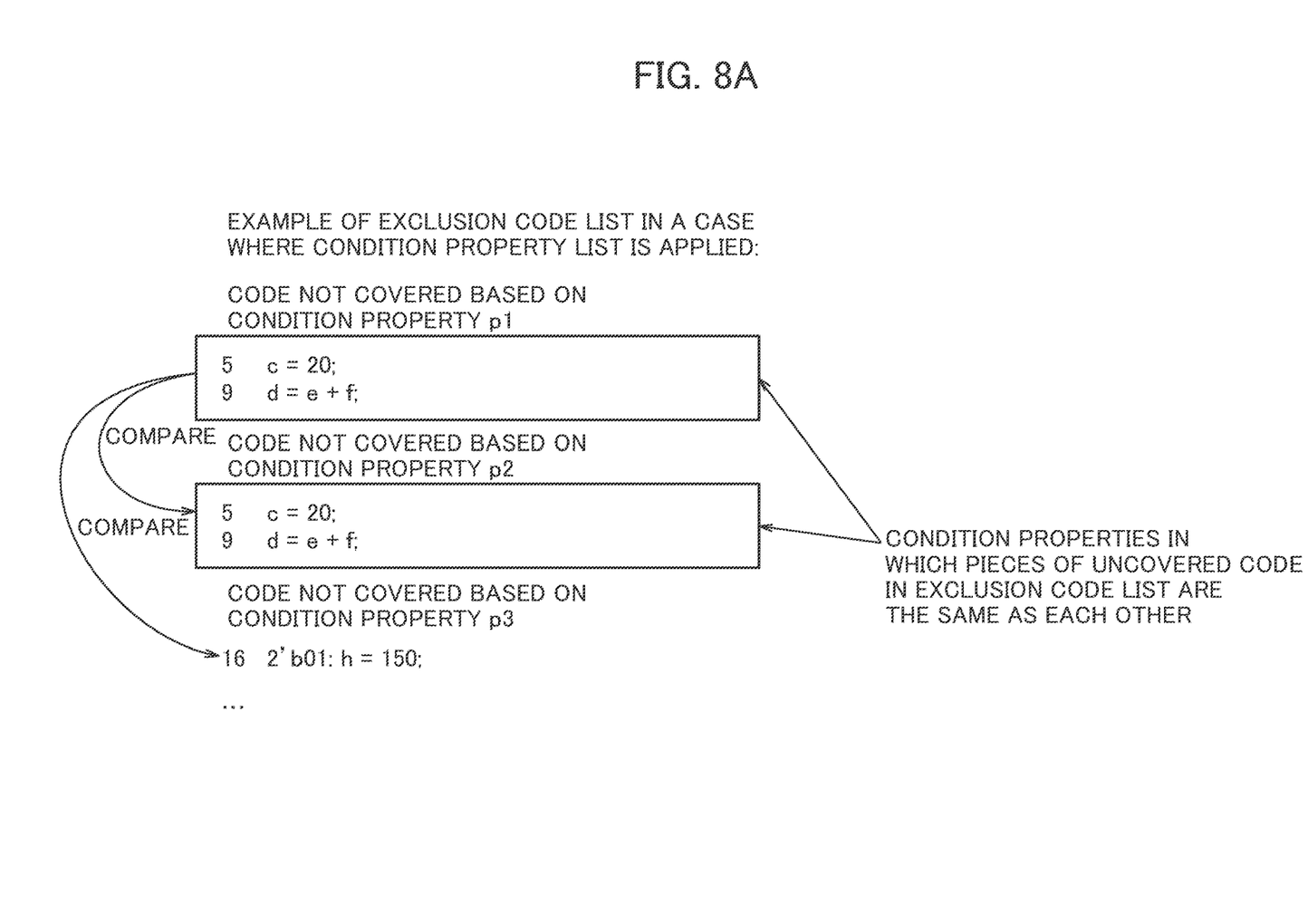
FIG. 8A shows an example of a second exclusion code list compared in a case where the condition property list is applied.
Figure 8B:
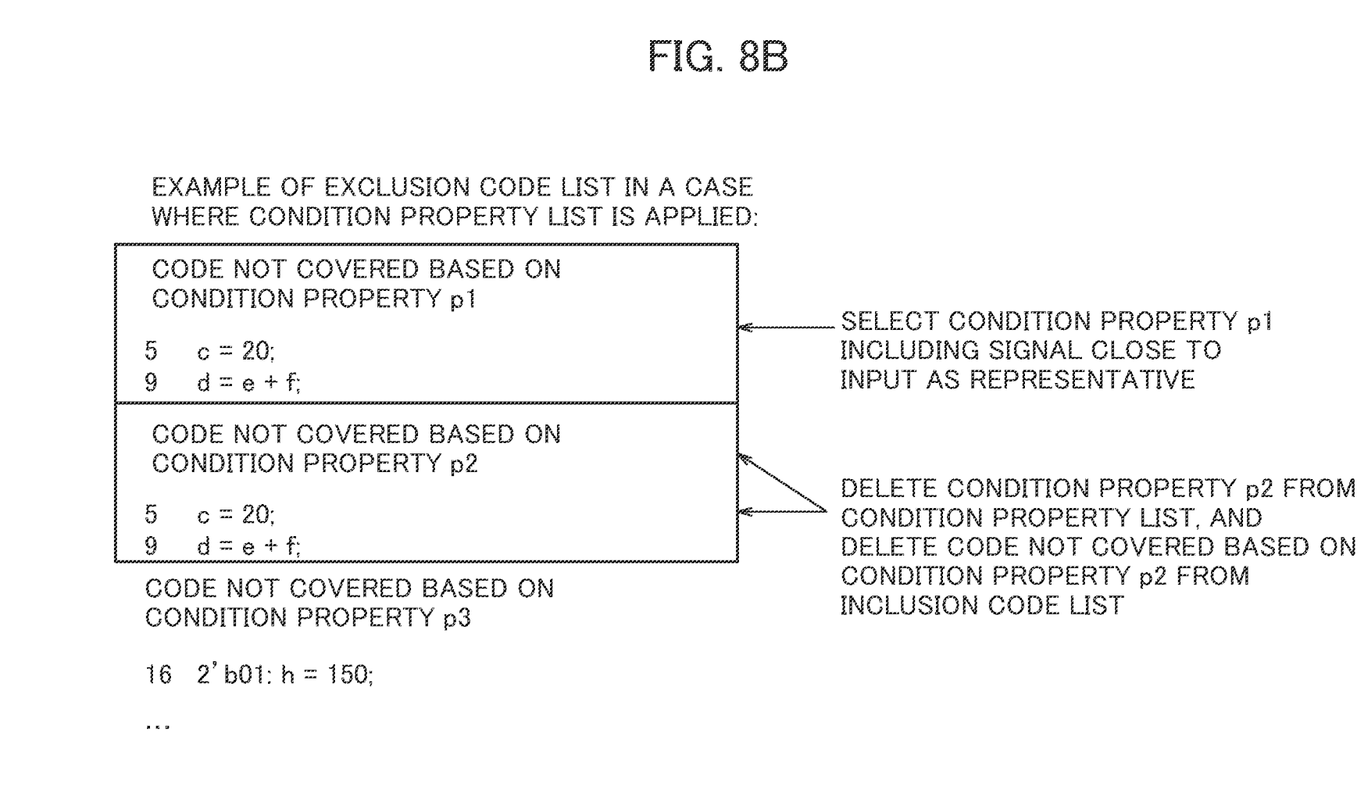
FIG. 8B is an explanatory diagram for explaining the deletion of uncovered code based on target condition properties from an example of the second exclusion code list in a case where the condition property list is applied.
Figure 9:
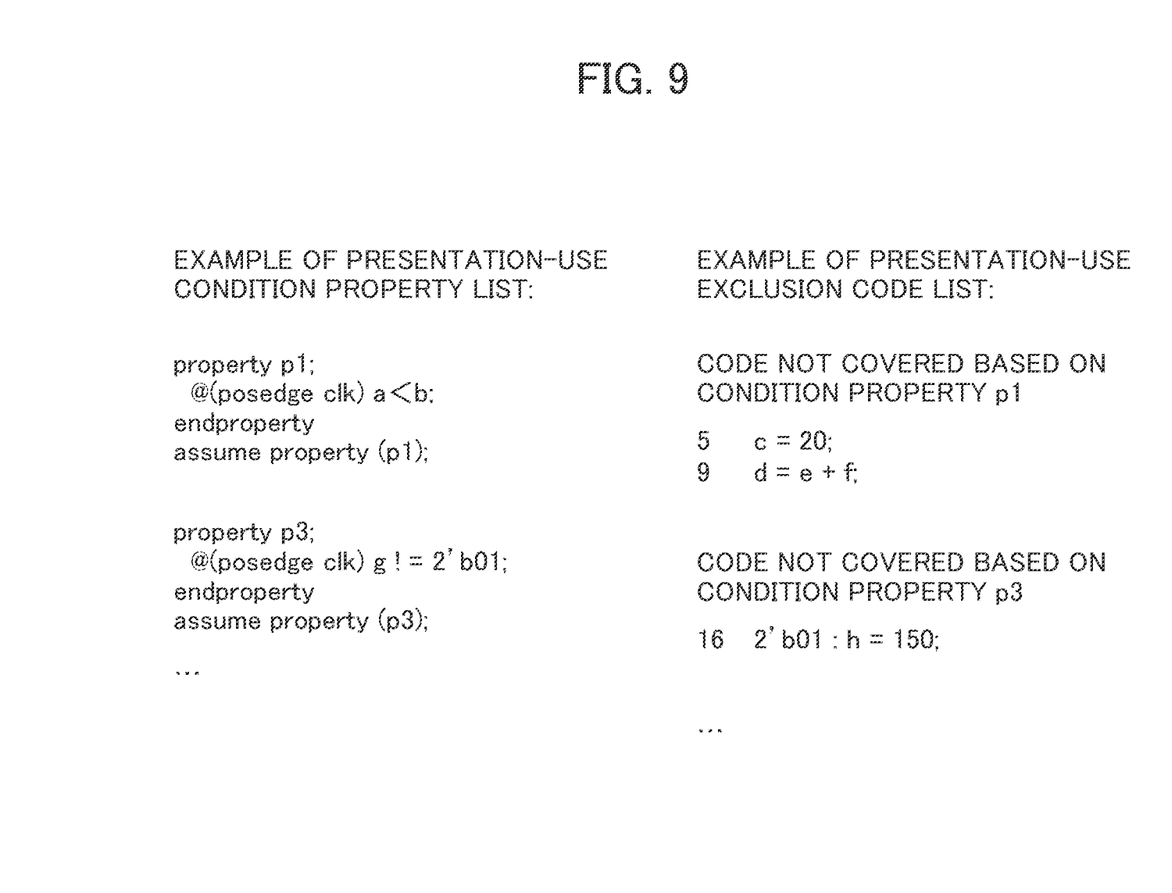
FIG. 9 shows an example of a condition property list and an exclusion code list which are presented to users.

FIG. 4A and FIG. 4B show an example of a detailed flowchart of the integrated circuit verification method of the integrated circuit verification device 1 according to the embodiment. FIG. 5A shows an example of coverage database code according to the embodiment. FIG. 5B shows an example of the coverage database code and an example of condition properties generated based on an example of the coverage database code. FIG. 6 shows an example of a condition property list. FIG. 7A shows an example of exclusion code in a case where the condition property list is not applied. FIG. 7B shows an example of a first exclusion code list in a case where the condition property list is applied. FIG. 8A shows an example of an exclusion code list which is compared. FIG. 8B shows an explanatory diagram for explaining the deletion of uncovered code. FIG. 9 shows an example of a condition property list and an exclusion code list which are presented to users.

In step S11, the logic simulator unit 21 executes a logic simulation.

In step S12, the uncovered code information extraction unit 221 reads the coverage database 421A and extracts the uncovered code. Specifically, as shown in FIG. 5A, the uncovered code information extraction unit 221 extracts, for example, the pieces of uncovered code p1, p2, p3, and p4 in the order of the 5th, 9th, 16th, and 17th lines in FIG. 5A. In the following description, the 20th to 25th lines of the coverage database code represent a section of the code which is proved not to be statically covered (represented by " . . . " in the figure).

In step S13, the condition property information generation unit 222 generates a plurality of condition properties from the extracted uncovered code based on the condition statements causing the uncovered code. Specifically, as shown in FIG. 5B, the condition property information generation unit 222, for example, generates a condition property p1 based on the condition statement (a<b) causing the uncovered code, with respect to the extracted uncovered code p1 on the 5th line in FIG. 5B. Similarly, the condition property information generation unit 222 generates, for example, a condition property p2 based on the condition statement (c==10) causing the uncovered code, with respect to the extracted uncovered code p2 on the 9th line in FIG. 5B. The condition property information generation unit 222 generates, for example, a condition property p3 based on the condition statement (g!=2'b01) causing the uncovered code, with respect to the extracted uncovered code p3 on the 16th line in FIG. 5B. The condition property information generation unit 222 generates, for example, a condition property p4 based on the condition statement (g!=2'b10) causing the uncovered code, with respect to the extracted uncover p4 on the 17th line in FIG. 5B.

In step S14, the condition property list information output unit 223 lists the generated condition properties. Specifically, as shown in FIG. 6, the condition property list information output unit 223 lists the generated respective condition properties in order in the condition property list.

In step S15, when the uncovered code information extraction unit 221 extracts all the uncovered code of the read coverage database 421A, the uncovered code information extraction unit 221 outputs the condition property list 422A, and proceeds to step S16. Specifically, the condition property list information output unit 223, for example, outputs the condition property list 422A to the condition property list information storage unit 422 when all the uncovered code has been extracted. If the uncovered code information extraction unit 221 has not extracted all the uncovered code in the read coverage database 421A, the process proceeds to step S12.

In step S16, the exclusion code generation unit 224 generates code which is proved not to be statically covered by the read RTL source code 412A as exclusion code. Specifically, as shown in FIG. 7A, the exclusion code generation unit 224 executes a formal verification without applying the condition property list, and generates the exclusion code on the 20th to 25th lines which are proved not to be statically covered.

In step S17, the exclusion code generation unit 224, based on the read RTL source code 412A and the condition property list 422A, generates the code which is proved not to be statically covered as a result of applying each condition property, as a first exclusion code list. Specifically, as shown in FIG. 7B, the exclusion code generation unit 224 executes a formal verification by applying the condition property list, and generates the code which is proved not to be statically covered by application of each condition property. In FIG. 7B, the exclusion code generation unit 224 generates, for example, the code on the 5th line, the 9th line, and the 20th to 25th lines, which are the code proved not to be covered (uncovered code) based on the condition property p1.

In step S18, when all pieces of the uncovered code for each condition property are extracted based on the read RTL source code 412A and the condition property list 422A, the exclusion code generation unit 224 lists the pieces of exclusion code which are pieces of uncovered code based on each condition property, and generates the condition property application exclusion code list 423B. Then, the process proceeds to step S19. The condition property list information output unit 223 may sort the generated exclusion list and output the condition property non-application exclusion code 423A and the condition property application exclusion code list 423B. When all pieces of the uncovered code for each condition property are not extracted based on the read RTL source code 412A and the condition property list 422A, the exclusion code generation unit 224 proceeds to step S17.

In step S19, the exclusion code comparison unit 225 makes a second exclusion code list from a difference between the exclusion code of the read condition property non-application exclusion code 423A and the first exclusion code list of the condition property application exclusion code list 423B. Specifically, as shown in FIG. 8A, for example, the exclusion code generation unit 224 lists the following pieces of exclusion code as differences: exclusion code that is not covered as an addition based on the condition property p1, exclusion code that is not covered as an addition based on the condition property p2, and exclusion code that is not covered as an addition based on the condition property p3.

In step S20, the exclusion code comparison unit 225 selects one piece of exclusion code in the second exclusion code list of the condition property application exclusion code list 423B for comparison.

In step S21, based on the selected exclusion code, the exclusion code comparison unit 225 determines whether or not there are condition properties with which the uncovered pieces of code in the second exclusion code list of the condition property application exclusion code list 423B are the same as each other. Specifically, as shown in FIG. 8A, the exclusion code comparison unit 225 determines that the pieces of code on the 5th and the 9th lines which are not covered based on the condition property p1 in the condition property application exclusion code list 423B are the same as the pieces of code on the 5th and the 9th lines which are not covered based on the condition property p2 in the condition property application exclusion code list 423B, and the process proceeds to step S22. If there are no condition properties with which the pieces of uncovered code in the exclusion list of the condition property application exclusion code list 423B are the same as each other based on the compared exclusion code, the exclusion code comparison unit 225 proceeds to step S24.

In step S22, for example, the exclusion code comparison unit 225 extracts a condition property including the signal close to the input from among the first condition property and the second condition property. Specifically, as shown in FIG. 8B, the exclusion code comparison unit 225 compares the condition property p1 (first condition property) in the condition property application exclusion code list 423B with the condition property p2 (second condition property) in the condition property application exclusion code list 423B.

Thereafter, for example, the exclusion code comparison unit 225 extracts, as a representative, the condition property p1 (first condition property) including the signal close to the input from among the first condition property and the second condition property when there is the first condition property and the second condition property, and proceeds to step S24. When the signal close to the input is not included in the condition property, the exclusion code comparison unit 225 proceeds to step S23.

In step S23, the exclusion code comparison unit 225 deletes the plurality of condition properties except for the extracted condition property, and deletes the exclusion code. Specifically, as shown in FIG. 8B, the exclusion code comparison unit 225 deletes the item of the condition property p2 in the condition property application exclusion code list 423B. Further, the exclusion code comparison unit 225 also deletes the item of the condition property p2 from the read condition property list 422A.

In step S24, the exclusion code comparison unit 225 lists the plurality of condition properties and the exclusion code. Specifically, the exclusion code comparison unit 225 lists the code in which the uncovered code is not deleted based on the respective condition properties in the condition property application exclusion code list 423B.

In step S25, the exclusion code comparison unit 225 determines whether the comparison and listing of all the condition properties have been completed in the exclusion list of the condition property application exclusion code list 423B. Specifically, when the comparison and listing of all the condition properties are completed, the exclusion code comparison unit 225 proceeds to step S26. If the comparison and listing of all the condition properties have not been completed yet, the exclusion code comparison unit 225 proceeds to step S20.

In step S26, the condition property list information output unit 223 and the exclusion code information output unit 226 output the presentation-use condition property list 422C and the presentation-use exclusion code list 423C. Specifically, as shown in FIG. 9, the condition property list information output unit 223 and the exclusion code information output unit 226 output, for example, the presentation-use condition property list 422C and the presentation-use exclusion code list 423C, which are sorted and listed in order of the condition properties with the largest amount of uncovered code based on the condition properties.

As described above, according to the embodiment, by means of the integrated circuit verification method, the integrated circuit verification device 1 can efficiently exclude uncovered code caused by the same underlying caused by deleting the condition property with which pieces of uncovered code in the exclusion list are the same as each other based on the compared exclusion code.

While certain embodiments have been described, these embodiments have been presented by way of examples only, and are not intended to limit the scope of the inventions. Indeed, the novel embodiments described herein may be embodied in a variety of other forms; furthermore, various omissions, substitutions and changes may be made without departing from the spirit of the inventions. These embodiments and variations thereof are included in the scope and the gist of the invention and are also included in the scope of the invention described in the claims and their equivalents.

For example, in another embodiment, a circuit description of register transfer level (RTL) source code, which is a design under test (DVT) data file, may be described in units of logic cones. In addition, the exclusion code comparison device 225 may select an input-side circuit of a logic cone in the circuit description in a case where a condition property including the signal close to the input is extracted from among the first condition property and the second condition property.

What is claimed is:

1. An integrated circuit verification device comprising:
   a condition property information generation unit configured to generate a plurality of condition properties that have information which imposes limitations on circuit operations or input signals, based on condition statements in a code list of a design data file;
   an exclusion code generation unit configured to generate, from the code list, exclusion code which is proved not to be statically covered, and a first exclusion code list to which the plurality of condition properties are applied; and
   an exclusion code comparison unit configured to generate a second exclusion code list from a difference between the exclusion code and the first exclusion code list, wherein
   the exclusion code comparison unit:
   determines whether or not there is a first condition property and a second condition property in the plurality of condition properties with which at least some pieces of uncovered code in the second exclusion code list are the same as each other, and
   extracts a condition property including a signal close to an input from among the first condition property and the second condition property when there is the first condition property and the second condition property.

2. The integrated circuit verification device according to claim 1, wherein
   the exclusion code is generated by performing a formal verification on the code list, and
   the first exclusion code list is generated by performing, on the code list, a formal verification having the plurality of condition properties applied thereto.

3. The integrated circuit verification device according to claim 1, further comprising:
   an uncovered code information extraction unit configured to extract the code list of the design data file from a coverage database including the design data file, as uncovered code.

4. The integrated circuit verification device according to claim 3, wherein
   the condition property information generation unit generates the plurality of condition properties based on condition statements causing each piece of uncovered code extracted by the uncovered code information extraction unit.

5. The integrated circuit verification device according to claim 1, wherein
   the exclusion code comparison unit deletes the plurality of condition properties except for the extracted condition property, and deletes the exclusion code.

6. The integrated circuit verification device according to claim 1, wherein
   the exclusion code comparison unit lists the plurality of condition properties and the exclusion code.

7. The integrated circuit verification device according to claim 1, wherein
   the design data file is register transfer level source code.

8. The integrated circuit verification device according to claim 7, wherein
   a circuit description of the register transfer level source code is described in units of logic cones.

9. The integrated circuit verification device according to claim 8, wherein
the exclusion code comparison unit selects an input-side circuit of a logic cone in the circuit description in a case where a condition property including the signal close to the input is extracted from among the first condition property and the second condition property.

10. An integrated circuit verification method comprising:
generating a plurality of condition properties that have information which imposes limitations on circuit operations or input signals, based on condition statements in a code list of a design data file;
generating from the code list, exclusion code which is proved not to be statically covered, and a first exclusion code list to which the plurality of condition properties are applied;
generating a second exclusion code list from a difference between the exclusion code and the first exclusion code list;
determining whether or not there are the plurality of condition properties with which at least some pieces of uncovered code in the second exclusion code list are the same as each other;
determining whether or not there is a first condition property and a second condition property in the plurality of condition properties;
extracting a condition property including a signal close to an input from among the first condition property and the second condition property when there is the first condition property and the second condition property; and
outputting a presentation-use condition property list and an presentation-use exclusion code list, which are sorted and listed in order of the condition properties with the largest amount of uncovered code based on the condition properties.

11. The integrated circuit verification method according to claim 10, further comprising:
generating the exclusion code by performing a formal verification on the code list; and
generating the first exclusion code list by performing, on the code list, a formal verification having the plurality of condition properties applied thereto.

12. The integrated circuit verification method according to claim 10, further comprising:
extracting, in an uncovered code information extraction unit, the code list of the design data file from a coverage database including the design data file, as uncovered code.

13. The integrated circuit verification method according to claim 12, further comprising:
generating, in a condition property information generation unit, the plurality of condition properties based on condition statements causing each piece of uncovered code extracted.

14. The integrated circuit verification method according to claim 10, further comprising:
deleting, in an exclusion code comparison unit, the plurality of condition properties except for the extracted condition property, and deleting the exclusion code.

15. The integrated circuit verification method according to claim 10, further comprising:
listing the plurality of condition properties and the exclusion code in the exclusion code comparison unit.

16. A non-transitory computer readable medium in which a computer program is stored, the computer program being executed by a computer used in a formal verification, the computer program comprising:
generating a plurality of condition properties that have information which imposes limitations on circuit operations or input signals, based on condition statements in a code list of a design data file;
generating from the code list, exclusion code which is proved not to be statically covered, and a first exclusion code list to which the plurality of condition properties are applied;
generating a second exclusion code list from a difference between the exclusion code and the first exclusion code list;
determining whether or not there is a first condition property and a second condition property in the plurality of condition properties with which at least some pieces of uncovered code in the second exclusion code list are the same as each other;
extracting a condition property including a signal close to an input from among the first condition property and the second condition property when there is the first condition property and the second condition property; and
outputting a presentation-use condition property list and an presentation-use exclusion code list, which are sorted and listed in order of the condition properties with the largest amount of uncovered code based on the condition properties.

17. The non-transitory computer readable medium in which the computer program is stored according to claim 16, the computer program further comprising:
generating the exclusion code by performing a formal verification on the code list; and
generating the first exclusion code list by performing, on the code list, a formal verification having the plurality of condition properties applied thereto.

18. The non-transitory computer readable medium in which the computer program is stored according to claim 16, the computer program further comprising:
extracting, in an uncovered code information extraction unit, the code list of the design data file from a coverage database including the design data file, as uncovered code.

19. The non-transitory computer readable medium in which the computer program is stored according to claim 18, the computer program further comprising:
generating, in a condition property information generation unit, the plurality of condition properties based on condition statements causing each piece of uncovered code extracted.

20. The non-transitory computer readable medium in which the computer program is stored according to claim 16, the computer program further comprising:
deleting, in an exclusion code comparison unit, the plurality of condition properties except for the extracted condition property, and deleting the exclusion code.

* * * * *